United States Patent
Ware

(10) Patent No.: US 8,054,707 B2
(45) Date of Patent: Nov. 8, 2011

(54) LOW ENERGY MEMORY COMPONENT

(75) Inventor: Frederick A. Ware, Los Altos Hills, CA (US)

(73) Assignee: Rambus Inc., Sunnyvale, CA (US)

( * ) Notice: Subject to any disclaimer, the term of this patent is extended or adjusted under 35 U.S.C. 154(b) by 242 days.

(21) Appl. No.: 12/464,604

(22) Filed: May 12, 2009

(65) Prior Publication Data

US 2009/0251982 A1    Oct. 8, 2009

Related U.S. Application Data

(63) Continuation of application No. PCT/US2007/084217, filed on Nov. 9, 2007.

(60) Provisional application No. 60/865,828, filed on Nov. 14, 2006.

(51) Int. Cl.
*G11C 7/00* (2006.01)

(52) U.S. Cl. ............... 365/222; 365/185.19; 365/226

(58) Field of Classification Search .......... 365/222, 365/185.19, 226, 207, 189.03, 191, 230.03, 365/185.33, 200
See application file for complete search history.

(56) References Cited

U.S. PATENT DOCUMENTS

| | | | |
|---|---|---|---|
| 2002/0097624 A1 | 7/2002 | Andersen | |
| 2002/0118588 A1* | 8/2002 | Kato | 365/210 |
| 2002/0186598 A1 | 12/2002 | Ooishi | |
| 2003/0189856 A1* | 10/2003 | Cho et al. | 365/200 |

FOREIGN PATENT DOCUMENTS

EP    0293933 A    12/1988

OTHER PUBLICATIONS

International Search Report and Written Opinion issued in PCT/US2007/084217, Jul. 9, 2008, 9 pages.

* cited by examiner

*Primary Examiner* — Dang Nguyen

(74) *Attorney, Agent, or Firm* — Morgan, Lewis & Bockius LLP

(57) ABSTRACT

The present invention is directed to a DRAM circuit that implements a self-refresh scheme to substantially reduce its power dissipation level during self-refresh operations. A ramped power supply voltage in replacement of a substantially invariant power supply voltage is used to power a sense amplifier in the DRAM circuit for amplifying a voltage difference between two bit lines coupled to the sense amplifier. As a result, the heat produced by the self-refresh operation is only a fraction of the heat produced by the conventional self-refresh powered by the substantially invariant power supply voltage.

15 Claims, 7 Drawing Sheets

LOW ENERGY MEMORY COMPONENT

RELATED APPLICATIONS

This application is a continuation of international application serial number PCT/US2007/084217, filed Nov. 9, 2007 which claims benefit of U.S. provisional application 60/865,828, filed Nov. 14, 2006, which are incorporated herein by reference in their entirety.

TECHNICAL FIELD

The subject matter disclosed herein relates generally to integrated circuit (IC) design, and in particular, to high-speed dynamic random access memory (DRAM) circuits with low energy consumption.

BACKGROUND

DRAM circuits (sometimes called DRAM's or DRAM devices) are used in computers and other electronic devices to store information. To keep the information intact, a DRAM circuit is periodically refreshed even if there is no read/write access to the circuit from other circuits. Refresh can be accomplished either by externally initiated refresh operations (i.e., under the control of commands sent by a device or circuit external to the DRAM) or by self-refresh, in which refresh operations are timed and controlled by circuitry internal to the DRAM. Refreshing the memory cells of a DRAM typically requires two operations: first reading the data in multiple memory cells (e.g., a row) and then writing the data back into the memory cells. The refresh operation consumes energy because it requires charging and discharging capacitors in the memory cells. In the course of refreshing a memory cell, it is also necessary to charge and discharge the capacitance of the bit line and word line structures that are coupled to the cell. Although refreshing a single row of memory cells uses very little energy, the DRAM circuit may expend a significant amount of energy on refresh operations because it has many rows of memory cells and needs to refresh them quickly and repeatedly. The energy used by refresh operations is ultimately turned into heat, which may cause or contribute to thermal issues in an electronic application that includes the DRAM circuit. For example, the application may need to incorporate an additional heat dissipation device in order to dissipate the heat generated by the DRAM circuits in the application, thereby increasing both the application's cost and size. Also, in a portable application, the energy used for refresh operations represents a continuous battery drain, and reducing the energy cost of refresh will increase the time interval until the battery needs recharging.

SUMMARY OF DISCLOSED EMBODIMENTS

The present invention is directed to a DRAM circuit that implements a self-refresh scheme to substantially reduce its power dissipation during self-refresh operations. During self-refresh operations, a ramped power supply voltage, instead of a traditional, substantially invariant power supply voltage, is used to power a sense amplifier in the DRAM circuit for amplifying a voltage difference between two bit lines coupled to the sense amplifier. As a result, the heat produced by the self-refresh operation is only a fraction of the heat produced by conventional self-refresh operations, which are powered by a substantially invariant power supply voltage.

In a first aspect of the present invention, a method of operating a memory cell and a sense amplifier, both coupled to a bit line, is disclosed. The method includes multiple modes. In a first mode of operation, a first memory operation is performed on the memory cell. The first memory operation includes amplifying a voltage associated with information stored in the memory cell using a substantially invariant power supply voltage. In a second mode of operation, a second memory operation is performed on the memory cell. The second memory operation includes amplifying a voltage associated with information stored in the memory cell using a ramped power supply voltage having a ramp transition time greater than an RC time constant associated with the bit line and the sense amplifier.

In a second aspect of the present invention, a method of operating a memory device including multiple memory banks is disclosed. The method includes performing concurrent operations on at least two memory banks. The operation performed on a first memory bank is a memory refresh operation. The refresh operation includes refreshing a memory cell in the first memory bank using a ramped power supply voltage having a ramp transition time greater than an RC time constant of a bit line coupled to the memory cell and a sense amplifier coupled to the bit line. At the same time, a memory access operation is performed on a second memory bank. The memory access operation includes accessing a memory cell in the second memory bank using a substantially invariant power supply voltage.

In a third aspect of the present invention, a memory device includes a memory cell coupled to a bit line and a sense amplifier coupled to the bit line and having a power input node. A first power supply terminal is coupled to the sense amplifier for providing to the sense amplifier a substantially invariant supply voltage. A second power supply terminal is coupled to the sense amplifier for providing to the sense amplifier a ramped voltage having a ramp transition time greater than an RC time constant associated with the bit line and the sense amplifier. Circuitry is provided for selectively coupling one of the first power supply terminal and the second power supply terminal to the power input node of the sense amplifier.

In a fourth aspect of the present invention, an apparatus includes one or more support structures, an inductor mounted on one of the support structures, and a memory device mounted on the same or a different support structure. The memory device includes a memory cell coupled to a bit line and a sense amplifier coupled to the bit line and having a power input node. A first power supply terminal is coupled to the sense amplifier for providing a substantially invariant supply voltage. A second power supply terminal is coupled to the sense amplifier and the inductor for providing a ramped voltage having a ramp transition time greater than an RC time constant associated with the bit line and the sense amplifier. Circuitry is also provided for selectively coupling one of the first power supply terminal and the second power supply terminal to the power input node of the sense amplifier.

BRIEF DESCRIPTION OF THE DRAWINGS

For a better understanding of the disclosure herein, reference should be made to the following detailed description taken in conjunction with the accompanying drawings.

Like reference numerals refer to the same or similar components throughout the several views of the drawings.

DETAILED DESCRIPTION OF THE EMBODIMENTS

DRAM is a type of random access memory, typically implemented in an integrated circuit that includes an array of DRAM memory cells, each of which may store a bit of data in a separate capacitor. As any real-world capacitor leaks electrons, the data stored at a capacitor eventually fades unless the capacitor charge is refreshed periodically. This refresh operation consumes energy, but the amount of consumed energy can be made different by using different types of power supplies.

Figure 1:
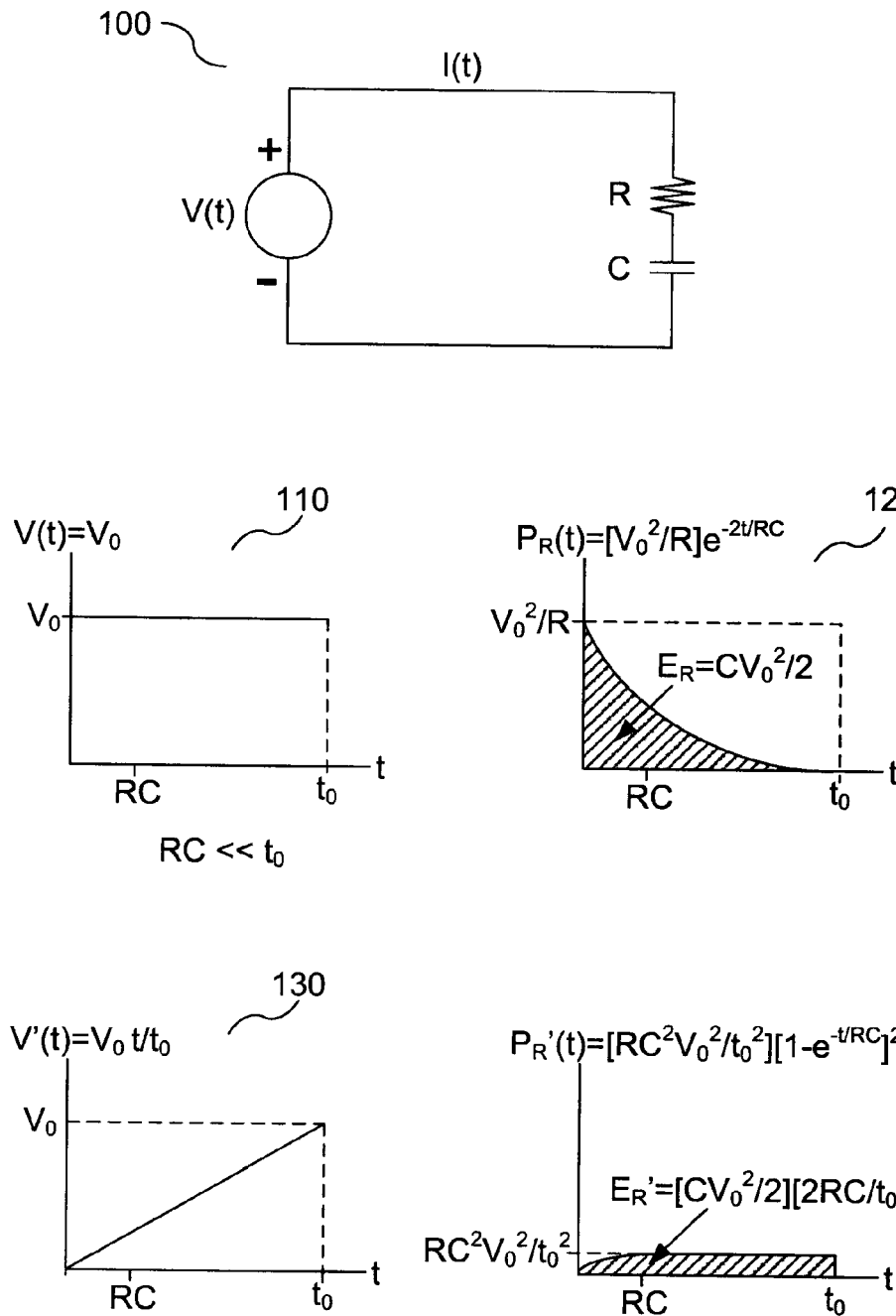
FIG. 1 is a block diagram of a circuit and its power consumptions under different types of power supply voltages.

FIG. 1 includes a block diagram of a circuit 100, two timing diagrams 110 and 130 showing voltage as a function of time, and two timing diagrams 120 and 140 showing power consumption as a function of time when using respective ones of the two different types of power supply voltages. The circuit 100 includes a resistor R, a capacitor C, and a power supply having a voltage V(t). The power supply is coupled across the serially-connected resistor and capacitor. The circuit has a time constant RC. A current I(t), which is dependent upon the voltage V(t), flows through the resistor to charge or discharge the capacitor. During the charging process, as depicted by the timing diagrams, the energy released by the power supply is divided into two portions, one portion accumulates in the capacitor while the other portion is converted into heat at the resistor and dissipated into the environment. The ratio between the two portions is dependent on the type of the power supply.

As shown in the timing diagrams 110 and 120 in FIG. 1, if the power supply provides a constant voltage $V(t)=V_0$ for a time period $t_0$ that is substantially longer than the time constant RC, the power consumed by the resistor R is $P_R(t)=[V_0^2/R]e^{-2t/RC}$. The energy consumed by the resistor is therefore $E_R=CV_0^2/2$ (which is equal to the area of the shadow zone). In other words, half of the energy released by the power supply, $CV_0^2$, is turned into heat while the other half is stored in the capacitor C.

But, as shown in the timing diagrams 130 and 140, if the power supply provides a ramped voltage, such as a linearly increasing voltage $V'(t)=V_0[t/t_0]$ for the same time period, the power consumed by the resistor R is $P_R'(t)=[RC^2V_0^2/t_0^2][1-e^{-t/RC}]^2$. The energy consumed by the resistor is reduced to $E_R'=[CV_0^2/2][2RC/t_0]$ (as indicated by the shadow zone). Because the time constant RC is significantly smaller than the time period $t_0$, the ratio of energy that is turned into heat to the energy that is stored in the capacitor C is now much smaller. If it takes an infinitely long time $t_0$ for the voltage to increase from zero to $V_0$, all energy released by the power supply is stored in the capacitor and the resistor does not turn any energy into heat. Such a process is also known as an "adiabatic process." Note that an ideal adiabatic process does not exist in the real world. But the theory suggests that charging a capacitor using a ramped voltage like the one in FIG. 1 causes the ratio of energy converted into heat to the energy stored in the capacitor to be much smaller than when the capacitor is charges using a constant voltage, so long as the ramp time is significantly longer (e.g., at least ten times longer) than the RC constant of the circuit.

The circuit in FIG. 1 can be viewed as a simplified model of a DRAM memory cell. The capacitor C is used for storing a data bit associated with the memory cell, and may also include the additional capacitance of the bit line that couples the sense amplifier to the storage cell. The resistor R approximates the resistance of sense amplifier transistors associated with the memory cell. Thus, a substantial amount of energy may be saved if a power supply producing a ramped voltage, not a constant voltage, is used for refreshing the memory cell.

Figure 2:
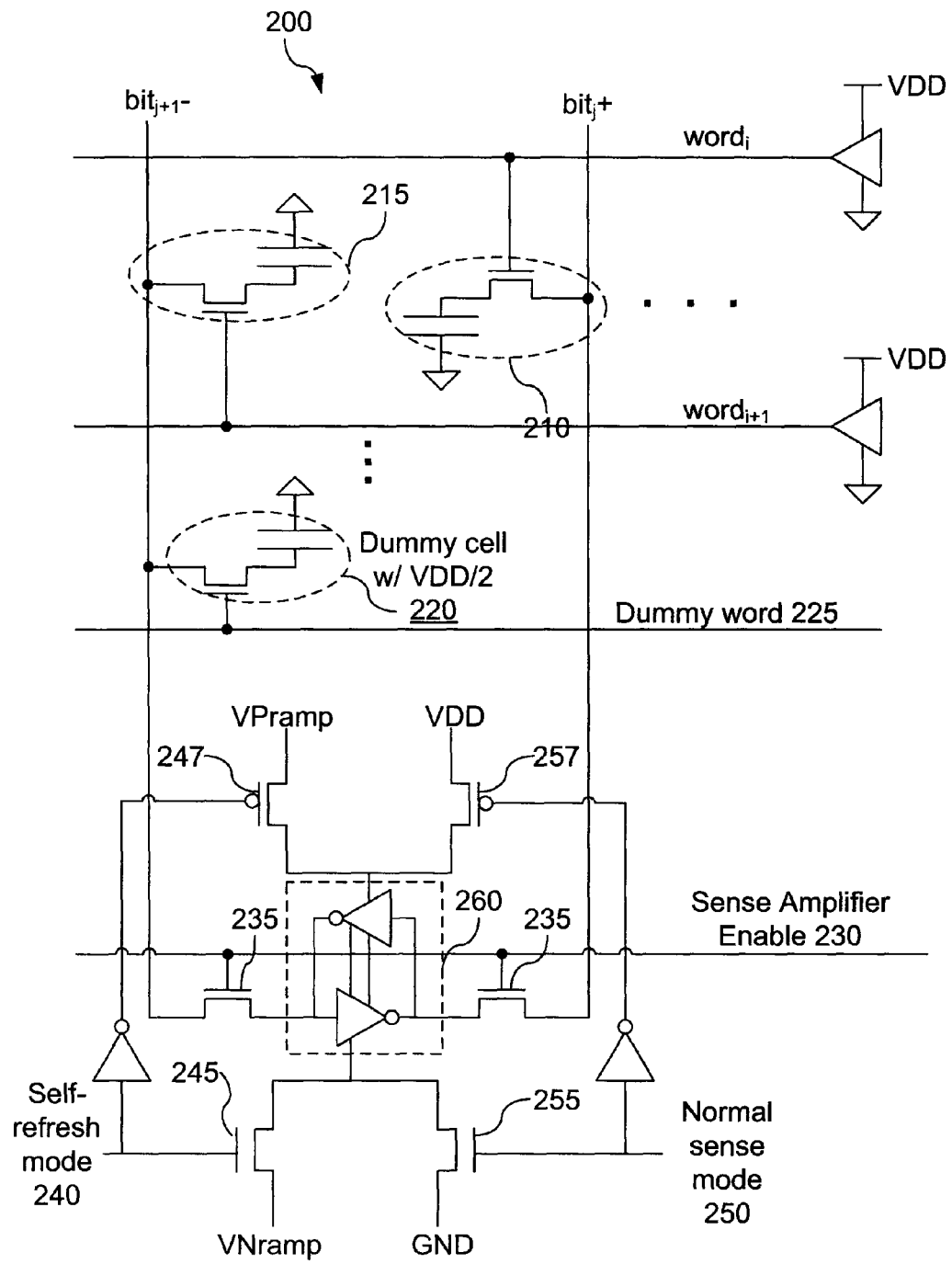
FIG. 2 is a block diagram of a DRAM circuit implementing an energy-efficient self-refresh scheme.

FIG. 2 is a block diagram illustrating embodiments of a DRAM circuit 200 implementing an energy-efficient self-refresh. For illustrative purposes, only two memory cells 210, 215 are shown in the figure, each having one capacitor and one transistor. Specifically, the memory cell 210 is coupled to the column or bit line "$bit_j+$" and the row or word line "$word_i$," and the memory cell 215 is coupled to the bit line "$bit_{j+1}-$" and the word line "$word_{i+1}$". The DRAM circuit 200 may also include a dummy word line 225 and a dummy cell 220. This DRAM circuit 200 is commonly referred to as a single transistor DRAM, or 1T DRAM. But one skilled in the art will understand that the self-refreshing methods and circuitry described herein are also applicable to other types of DRAM infrastructures.

In some embodiments, to refresh the row including the memory cell 210, a row decode logic (not shown in the figure) selects the word line "$word_i$", which turns on the transistor in the memory cell, coupling the capacitor in the memory cell to the bit line "$bit_j+$." The capacitor then dumps its electrical charge on the bit line "$bit_j+$." To measure the memory cell 210's data bit, the dummy word line 225 is also selected, which allows the dummy cell 220 to dump its charge onto the other bit line "$bit_{j+1}-$."

The two bit lines are coupled to a sense amplifier 260 through two transistors 235, respectively. When the sense amplifier enable line 230 is activated, the voltages at the two bit lines are input into the sense amplifier 260. As shown in FIG. 2, the sense amplifier 260 may be a conventional sense amplifier including P-MOS and N-MOS transistors (not shown) forming a positive-feedback latch that amplifies the voltage difference at the two bit lines. If the voltage at the bit line "$bit_j+$" is higher than the voltage at the bit line "$bit_{j+1}-$", an amplified voltage difference causes the DRAM circuit to charge the bit line "$bit_j+$" and the memory cell 210 ends up storing a "1" data bit. If the voltage at the bit line "$bit_j+$" is lower than the voltage at the bit line "$bit_{j+1}-$", the memory cell ends up with a "0" data bit. In either case, the data bit originally stored in the memory cell is restored.

A read access to the memory cell 210 is similar to the refresh process except that the sense amplifier also transfers the data bit from the accessed memory cell to another component (e.g., a data output driver). A write access to the memory cell 210 forces the DRAM circuit to replace the old data bit detected by the sense amplifier 260 with a new one and then charge the memory cell 210 in accordance with the new data bit.

Conventionally, the sense amplifier 260 is powered by the same constant power supply voltage VDD regardless of what operation (self-refresh, burst-refresh, read access, or write access) is being performed by the DRAM circuit. When the application including the DRAM circuit is forced into a sleep mode or other low power mode, i.e., there is no read/write access to the circuit for a substantially long time period, the DRAM circuit periodically performs self-refresh on the memory cells in each row of the DRAM array of memory cells. As discussed above in connection with FIG. 1, a substantial amount of energy is turned into heat during this process.

To reduce the energy loss, as shown in FIG. 2, the PMOS-transistors of the sense amplifier 260 are coupled to two PMOS transistors 247, 257 and the NMOS-transistors of the sense amplifier 260 are coupled to two NMOS transistors 245, 255. The PMOS transistor 257 and NMOS transistor 255 are selected when the DRAM circuit is in a normal sense mode, which is active when a normal sense mode signal 250 is active. In some embodiments, the normal sense mode includes burst refresh, read, write, and precharge operations to the DRAM circuit. When the DRAM circuit operates in the normal sense mode, a substantially invariant power supply voltage (VDD–GND) is applied to the sense amplifier 260 (by transistors 255, 257) because performance is critical to these operations and such a constant voltage is important to achieve a better performance like a fast read/write access to a memory cell in the circuit.

The other pair of PMOS transistor 247 and NMOS transistor 245 is activated when the DRAM circuit is in a self-refresh mode, which is active when a self-refresh mode signal 240 is active. In some embodiments, the self-refresh mode is activated if the application including the DRAM circuit is forced into a sleep mode. In some embodiments, the mode is activated after the DRAM circuit receives no access request for at least a predefined time period. In some embodiments, the self-refresh mode is activated by a memory controller (external to the DRAM circuit) following a predefined schedule even if the DRAM circuit is not forced into sleep. For example, an application may include multiple DRAM circuits and it accesses a subset of the memory circuits at one time. If there is a predetermined access schedule, the memory controller can be programmed to activate selected memory devices (e.g., DRAM circuits) while the other unselected memory devices (e.g., DRAM circuits) perform self-refresh. In some embodiments, the pair of PMOS and NMOS transistors 247 and 245 (for coupling the ramped power supply voltage to the sense amplifier 260) is shared by the sense amplifiers of adjacent bit lines during the self-refresh mode.

When the DRAM circuit is being self-refreshed, it does not have any external access requests to service. As a result, during self-refresh there are no performance considerations with respect to external access requests, and therefore performance considerations are outweighed by energy conservation during self-refresh. By replacing the constant power supply voltages VDD and GND with ramped power supply voltages VPramp and VNramp, the DRAM circuit can save a substantial amount of energy. Saving energy in an application with DRAM can prolong the application's operating lifecycle if the application is a mobile device powered by a battery.

Figure 3:
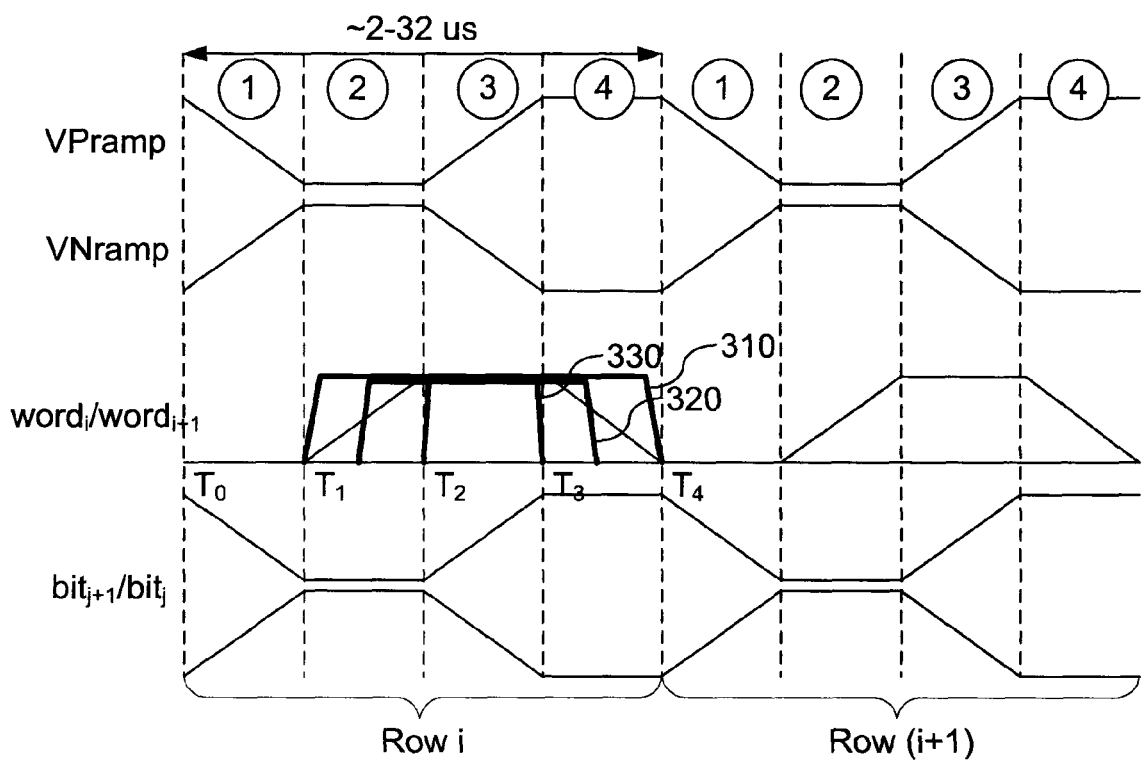
FIG. 3 is a time diagram illustrating the operation of the DRAM circuit of FIG. 2 in a self-refresh mode.

FIG. 3 is a timing diagram illustrating operation of the DRAM circuit of FIG. 2 in the self-refresh mode according to some embodiments. As shown in FIG. 3, the two ramped voltages VPramp and VNramp are supplied using two voltage signals, respectively. The two voltage signals vary periodically between a high voltage and a low voltage. There is an 180° phase difference between the two signals. In some embodiments, the DRAM circuit performs self-refresh row by row, each row corresponding to one time period of the ramped voltages. In some embodiments, the length of a time period is approximately 2 to 32 μs.

Figure 4:
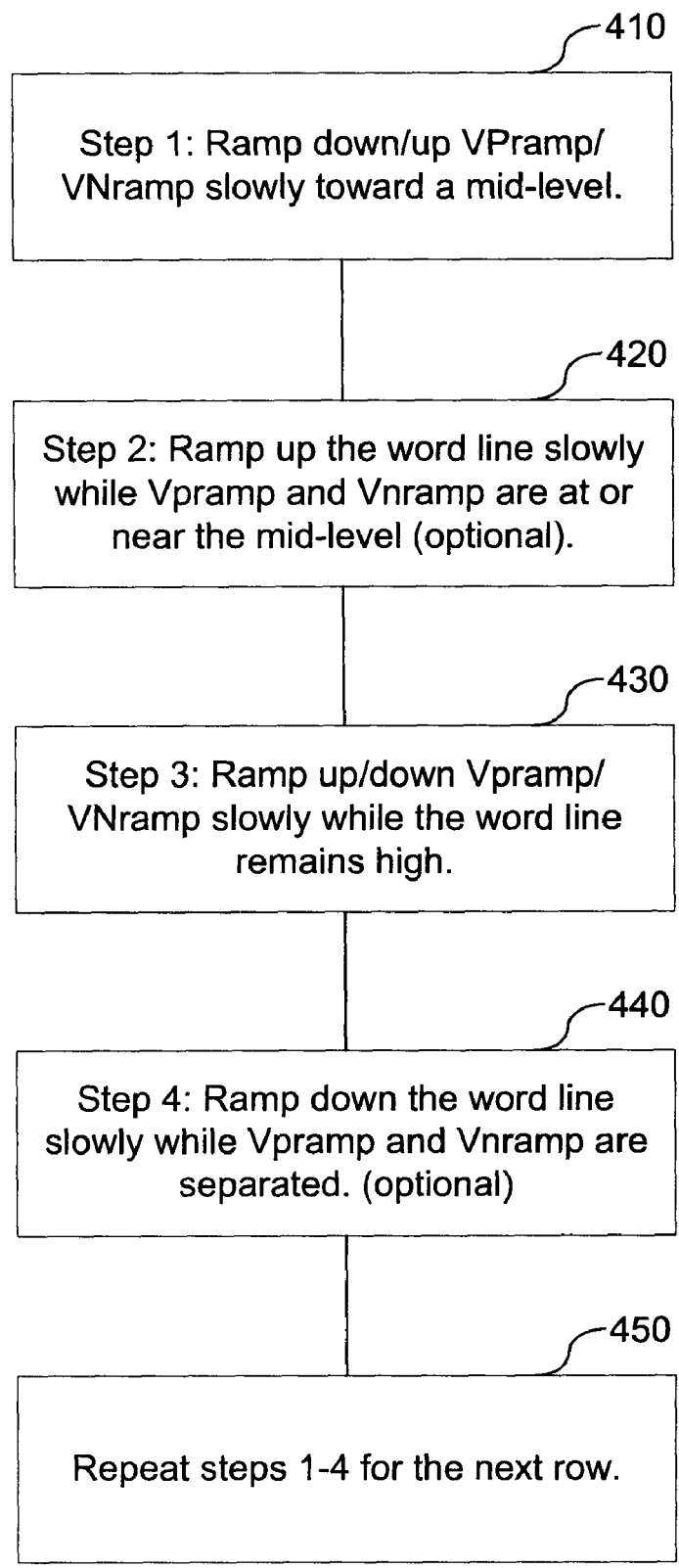
FIG. 4 is a flowchart illustrating the operation of the DRAM circuit of FIG. 2 in the self-refresh mode.

FIG. 4 is a flowchart illustrating the operation of the DRAM circuit of FIG. 2 in the self-refresh mode according to some embodiments. For illustrative purposes, each signal period of the voltage signals VPramp and VNramp is divided into first, second, third and fourth sub-periods corresponding to four operations, respectively. At the beginning of the first sub-period (from $T_0$ $T_1$), VPramp is at or near the high voltage (e.g., VDD) and VNramp is at or near the low voltage (e.g., GND). During the first sub-period, the DRAM circuit starts refreshing memory cells in the row i by ramping down VPramp and ramping up VNramp toward a mid-level (410) between the high voltage and the low voltage.

Referring back to FIG. 2, as the two voltages approach the mid-level, the sense amplifier 260 is slowly turned off and the energy present in the two bit lines gradually flows into an inductor 522 (FIG. 5A) coupled to the nodes VPramp and VNramp. A more detailed description of the inductor 522 is provided below in connection with FIGS. 5A and 5B.

Figure 5A:
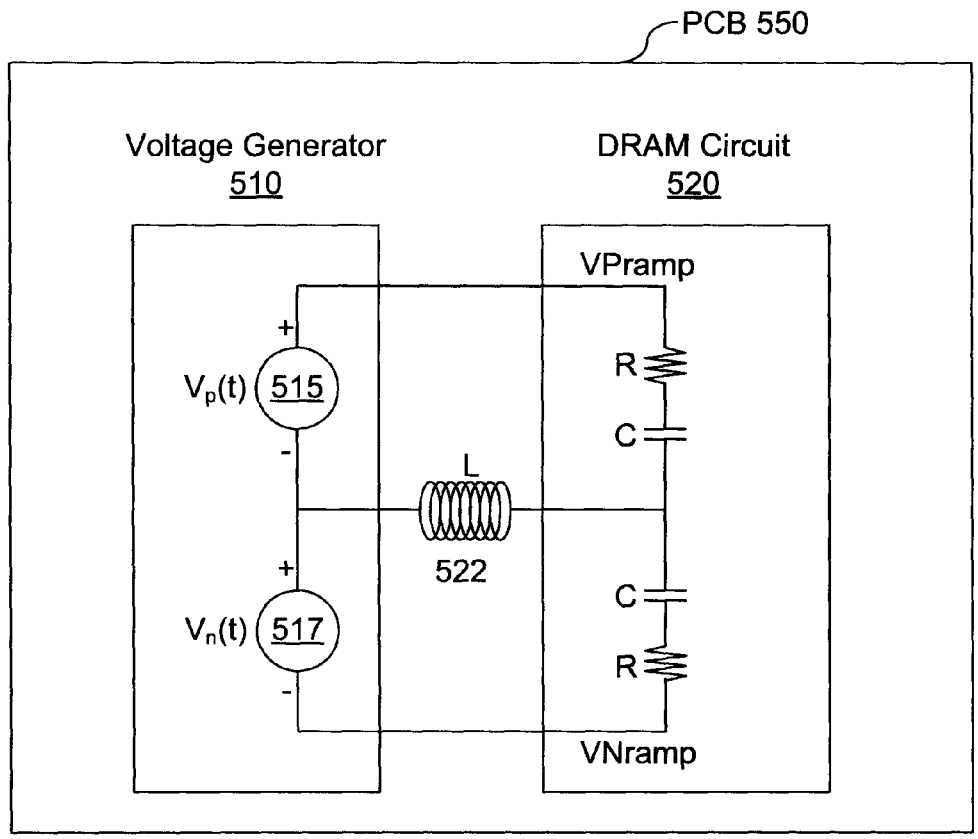
FIG. 5A is a block diagram of a ramped voltage generator.

FIG. 5A is a block diagram of such a ramped voltage generator according to some embodiments of the present invention. The voltage generator 510 includes two sub-generators, $V_p(t)$ 515 and $V_n(t)$ 517. Each sub-generator produces a sinusoidal wave signal and there is an 180° phase shift between the two signals. For illustrative purposes, the memory cells in DRAM circuit 520 are each modeled as a serially-connected capacitor C and resistor R. The capacitor C corresponds primarily to the capacitance of each bit line coupled to the sense amplifier and the resistor R corresponds primarily to the resistance of the transistors in the sense amplifier. An inductor L 522 is coupled between the sub-generators, $V_p(t)$ 515 and $V_n(t)$ 517 on one side and the two resistor-capacitor pairs on the other side of the inductor. This inductor 522 is carefully chosen such that an LC resonator comprising the inductor L 522 and the capacitor C has a voltage alternating frequency determined by a desired ramp transition time $t_0$.

In some implementations, the value of the inductor L might vary across a relatively wide range because of normal manufacturing tolerances. As a result, the self-refresh frequency may not match the LC resonant frequency, reducing the ability of the resonator to retain energy through each cycle.

One method of optimizing the self-refresh frequency relative to the LC resonant frequency is to simply set the self-refresh frequency to match whatever value L and C happen to be for that DRAM. This has the disadvantage that the refresh rate will be higher than what is needed by the DRAM, but it still may result in an energy saving.

A second way is to fine tune the capacitance presented by the DRAM. The capacitance formed by the bit lines could be augmented by a set of binary-weighted capacitors implemented on the DRAM (sometimes herein called a programmable capacitance). The capacitors would be attached to the VNramp and VPramp nodes through individual MOS pass transistors whose gates are enabled or disabled by configuration signals inside the DRAM. By connecting the extra capacitance to the VNramp and VPramp nodes, the activation power of normal read, write, and burst refresh transactions will not be increased.

The configuration signals would be driven from programmable fuses, pins, non-volatile storage cells, register or latch bits, or other means which are functionally equivalent to any of these methods. The weighted capacitors could be statically switched in or out of the resonant circuit so that variations in L could be accommodated by a complementary programmable variation in the total capacitance C. This would permit the resonator to operate near its natural frequency where the Q factor is a maximum.

One method to utilize the weighted capacitors is to fine tune the total capacitance value during a manufacturing step—in this case the capacitance enable signals would be set by programmable fuses or some other form of non-volatile storage. A second method would be to utilize a system initialization process. This process might be performed once, with the capacitance selection signals retained in some part of the system memory that is non-volatile. These selection signal values would be loaded into a register in the DRAM each time the system is turned on, with the capacitance selection signals stored directly into the DRAM registers.

Furthermore, if the inductor is included on the same substrate as the DRAM, it might be possible to fine tune the inductor value with a series of binary weighted inductor segments. This might have some advantages over the weighted capacitor method. The inductor configuration signals would be programmed using the same methods already described.

The inductor 522 may have different physical configurations. In some embodiments, the inductor is on-chip, i.e., on the same substrate as the DRAM circuit. The DRAM circuit including the inductor is encapsulated in a package. The package has an interface (e.g., one or more pins) allowing the DRAM circuit to communicate with other components, such as a memory controller. In some embodiments, the inductor is off-chip or external to the package housing the DRAM circuit. For example, the inductor may be mounted on a substrate (e.g., a printed circuit board 550) that also supports the DRAM circuit. Alternately, the inductor 522 may be mounted on the package housing the DRAM circuit. The inductor may be housed in its own package. The inductor 522 is electrically coupled to pins of its package, and produces ramped power supply voltages having a desired frequency. The inductor 522 may be shared by multiple DRAM circuits on a memory module by coupling the inductor to multiple DRAM circuits. By sharing the inductor across two or more DRAMs (and thereby increasing the effective capacitance), the inductance value needed is reduced, making it less expensive. In some embodiments, the inductor and the DRAM circuit co-exist in a system-in-package (SIP) setup.

Figure 5B:
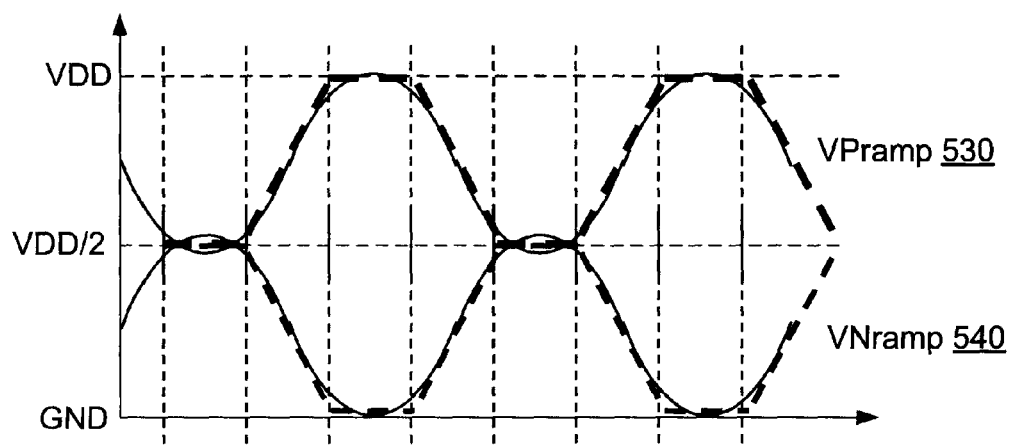
FIG. 5B is a time diagram of ramped voltages generated by the voltage generator.

FIG. 5B is a time diagram of two ramped voltages generated by the voltage generator according to some embodiments of the present invention. The two dashed lines represent the ideal ramped power supply voltages as shown in FIG. 3. The two solid curves represent the sinusoidal wave power supply voltages, VPramp 530 and VNramp 540. The VPramp curve oscillates between VDD and VDD/2 while the VNramp oscillates between VDD/2 and GND. If the DRAM circuit applies the two voltage signals to its sense amplifiers during the self-refresh mode, the energy in the circuit is stored alternately in the electric field of the capacitors and the magnetic field of the inductor. A small amount of energy is lost during each cycle because of resistive elements and is replaced by the voltage sources.

In some embodiments, a DRAM circuit shown in FIG. 2 has a mode switch circuit to couple the sense amplifier to either a constant power supply voltage during the normal sense mode or a ramped power supply voltage like the one shown in FIG. 5A during the self-refresh mode. In some embodiments, this mode switch circuit is integrated into the DRAM circuit. In some other embodiments, the mode switch circuit is external to the DRAM circuit. For instance, the mode switch circuit may be integrated into a memory controller.

As noted above, when a DRAM circuit is in a sleep mode, there is no read/write access to any memory bank in the circuit. All the memory banks are self-refreshed using a ramped power supply voltage to conserve energy. In the normal sense mode, the DRAM circuit performs read and write operations to memory cells in its memory banks using a substantially constant power supply voltage to achieve a specified or predefined level of performance. Because of capacitor leakage, the DRAM circuit also performs burst refresh operations using the constant power supply voltage in addition to the read and write transactions. In some cases, a DRAM circuit may use about 2% of the read/write transaction timeslots for the burst refresh operations. The burst refresh operations not only consume more energy than the self-refresh operations, but because they interfere with normal memory access operations, the refresh time interval is typically maximized so as to minimize the percentage of timeslots occupied by the refresh operations. Using a longer refresh time interval requires using a higher voltage VDD to avoid losing information. This requirement aggravates the energy consumption problem in the normal sense mode.

On the other hand, in some modes of operation, or when the application is executing certain tasks, there might be no read/write access to some memory banks within the DRAM circuit for a long time period in the normal sense mode, e.g., if the read/write access is limited to a subset of the memory banks. This scenario is more likely to happen in some specially-designed DRAM circuits, e.g., video DRAM, where there is a predefined memory access pattern. If the memory controller knows in advance which set of memory banks will be accessed and which set of memory banks will not be accessed in the normal sense mode, it can refresh the set of memory banks that receives no read/write access using a ramped power supply voltage so as conserve energy, while applying a constant power supply voltage to the other set of memory banks to maximize DRAM performance. Therefore, if different parts of a DRAM circuit are dynamically allocated to the two types of operations independently, there can be a net savings of energy even during the normal sense mode.

FIG. 3 depicts that the voltages at the two bit lines, $bit_{j+1}/bit_j$, also converge from a high level and a low level, respectively, to a mid-level while the two power supply voltages reach their mid-level. The voltage difference between the two bit lines drops to zero (or substantially zero, e.g., less than 5 millivolts) approximately at the end of the first sub-period (from $T_0$ to $T_1$). Note that no word line is selected during this sub-period. Each memory cell is presumed to retain sufficient charge corresponding to the data bit stored in the memory cell. In some implementations, the sense amplifier of FIG. 2 further includes an equalization device, such as an NMOS transistor whose source and drain are connected to the two bit lines. The gate of the NMOS transistor would be raised during the first half of the second sub-period (see FIG. 3), which would cause the voltage level of the two bit line to become exactly equal. During the second half of the second sub-period, the word line would be raised (see 320, FIG. 3).

During the second sub-period (from $T_1$ to $T_2$), the power supply voltages VPramp and VNramp remain at or near the mid-level. This causes the sense amplifier to remain off and the two bit lines are decoupled from each other while having substantially the same voltage. At the same time, the DRAM circuit slowly ramps up the voltage at the word line "$word_i$" (420). When this voltage is increased above the threshold voltage of the transistor within memory cell 210, the memory cell's transistor is turned on and the capacitor in the memory cell begins to dump its charge to the bit line "$bit_j+$". At the same time, the DRAM circuit activates the dummy word line 225 to dump charge from the dummy cell to the other bit line "$bit_{j+1}-$". Thus, at time $T_2$, there is a small voltage difference between the two bit lines coupled to the sense amplifier; the voltage difference representing the data value in memory cell 210.

As noted above, the DRAM circuit performs self-refresh row by row. Thus, the bulk of the self-refresh energy is stored in the hundreds or even thousands of bit lines coupled to a row of memory cells being refreshed. Slowly ramping a single word line does not conserve much energy. Therefore, operation 420 may be optional in some embodiments. For example, the word line is asserted to a high level as early as at time $T_1$ (310, FIG. 3). In some other embodiments, the word line is not asserted to the high level until at time $T_2$ (330, FIG. 3). Since charge or discharge of a bit line is very fast (e.g., 5-10 ns), an assertion of the word line at any moment during the sub-period ($T_2$–$T_1$) is acceptable (see 320, FIG. 3).

Next, the DRAM circuit slowly ramps up VPramp and ramps down VNramp while the word line is asserted high for the row i (430). The sense amplifier 260 (FIG. 2) is slowly turned on during this sub-period ($T_3$–$T_2$). The sense amplifier 260 detects and amplifies the voltage difference between the two bit lines. This amplified voltage difference causes the two bit lines to be charged (or discharged) depending on the data bit value of memory cell 210. As shown in FIG. 3, the voltages at the two bit lines start diverging in opposite directions during this sub-period. At the end of the sub-period, the capacitor in memory cell 210 is fully charged (or discharged) because the word line "words" remains asserted during the same time period.

Finally, the DRAM circuit slowly ramps down the word line "word$_i$" to complete the self-refresh of the row of memory cells selected by the word line (440). The voltages at the two bit lines remain separated. So long as the sense amplifier enable signal 230 remains on and the two ramped voltages VPramp and VNramp are at high and low levels, respectively, the sense amplifier 260 maintains the previously established bit line voltages. The sense amplifier enable signal 230 remains high during the entire self-refresh interval. When the sense amplifier enable signal 230 is turned off or disabled (as early as time $T_3$, and no later than time $T_4$), the bit lines are isolated and remain at the previously established voltages until a new memory operation begins. Like operation 420, this operation is also optional for the same reasons mentioned above. In other words, the self refresh is completed whenever the word line is de-selected some time during the sub-period ($T_4$–$T_3$). The word line does not have to be slowly ramped down, although this may save additional energy. At the end of the sub-period ($T_4$–$T_3$), the DRAM circuit proceeds to refresh the next row of memory cells by repeating the operations mentioned above (450).

In sum, the DRAM circuit visits every row in the circuit at a predetermined time interval during the self-refresh mode and refreshes the information stored in the row. For example, if the time interval is 32 ms and there are 2048 rows in the circuit, each row of memory cells has a time window of about 16 μs to be refreshed. In this example, the average length of a sub-period is about 4 μs. In other words, the ramp transition time $t_0$=($T_1$–$T_0$) or ($T_3$–$T_2$) is a few microseconds (e.g., 4 μs, or 1 to 16 μs in various DRAM configurations), which is substantially slower than the natural response time (RC time) of the bit line. The RC time constant of the two bit lines (which are the primary capacitor) and the sense amplifier (which is the primary resistor) is only a few nanoseconds (e.g., 1 to 20 ns). Therefore, the ratio between the ramp transition time $t_0$ and the RC time constant is at least one hundred, is more typically at least two hundred, and in some embodiments is more than one thousand. Based on the analysis above in connection with FIG. 1, this ratio indicates that the heat dissipation during the self-refresh mode is less than 1% of the heat dissipation during the normal sense mode. Other factors (such as the Q-factor of the inductor) might limit the heat reduction to less than 99%, but the improvement would still be significant.

A key factor in the DRAM circuit of FIG. 4 that significantly reduces the heat dissipation is that the ramped power supply voltage (VPramp–VNramp) replaces the constant power supply voltage (VDD–GND) during the self-refresh mode. But generating the exact ramped power supply voltage signals as shown in FIG. 3 is not trivial. A complex circuit may be required to produce such a signal. Fortunately, the two voltage signals VPramp and VNramp are similar to a sinusoidal wave with an 180° phase shift. It is possible to approximate each one by a sinusoidal wave signal having a constant voltage offset.

Figure 6:
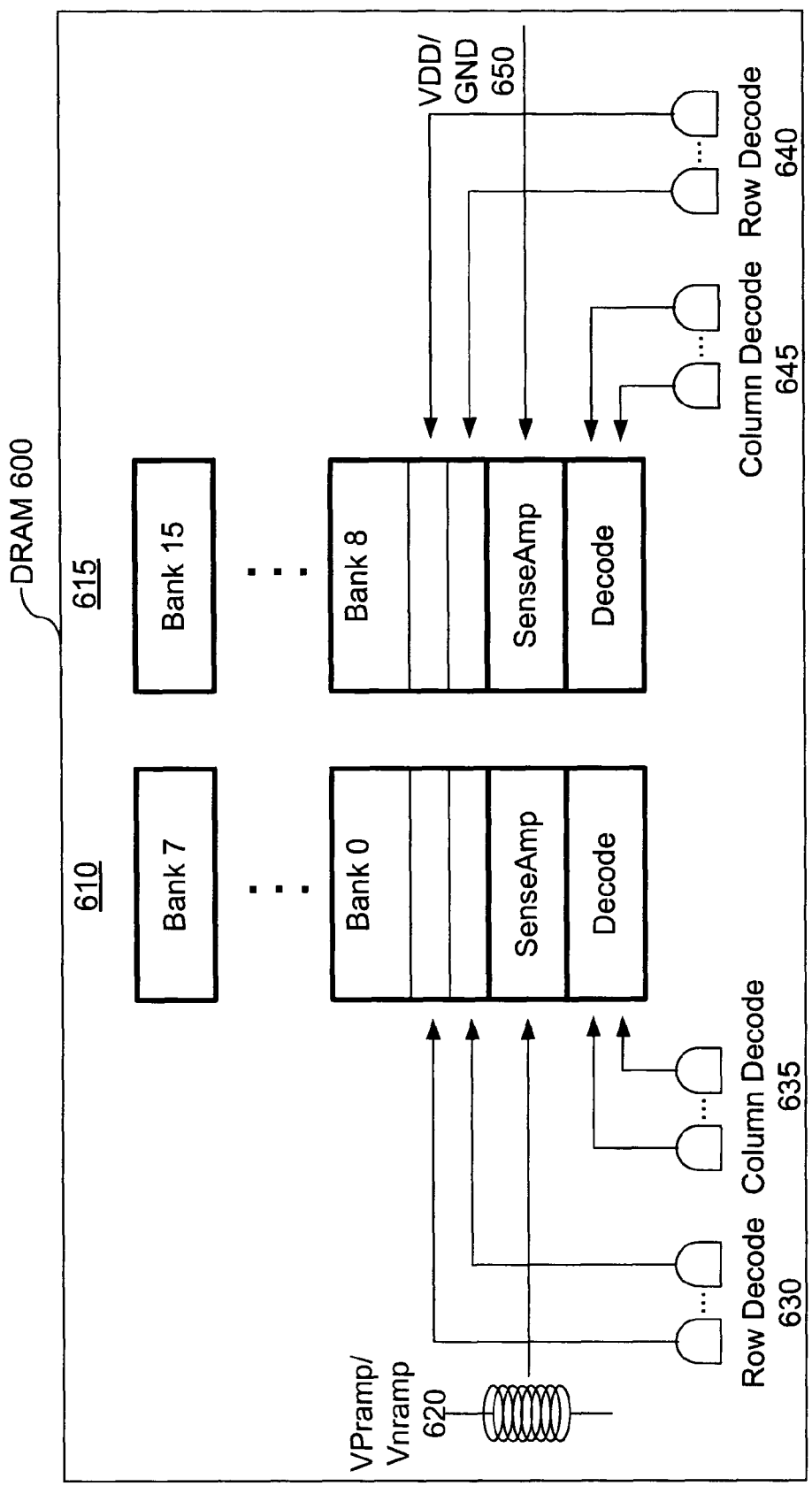
FIG. 6 is a block diagram of a DRAM circuit including at least two sets of memory banks performing different types of operations.

FIG. 6 is a block diagram of a DRAM circuit 600 including at least two sets of memory banks performing different types of operations according to some embodiments of the present invention. One set of memory banks 610 (including Bank 0 to Bank 7) performs burst refresh operations using a ramped power supply voltage 620. At the same time, the other set of memory banks (including Bank 8 to Bank 15) performs normal read/write operations using a constant power supply voltage 650. FIG. 6 also shows that the two sets of memory banks 610, 615 use different sets of decoded row and column signals 630, 635 and 640, 645.

By decoupling the two types of memory operations from each other, i.e., having the burst refresh operations carried out in one set of memory banks and the read/write transactions carried out in another set of memory banks, with the two sets of memory banks being switched periodically, the refresh time interval $t_{ref}$ (which the length of time between two successive refresh operations on the same row of memory cells) can be reduced without affecting the DRAM circuit's performance—because the refresh operations no longer interfere with the normal access operations.

By increasing the burst refresh rate, and thus reducing the refresh time interval $t_{ref}$, a higher leakage current in a memory cell can be tolerated before the data bit in the memory cell fades. Being able to tolerate a higher leakage current translates into being able to use a lower constant power supply voltage VDD for read/write operations. And reducing the constant power supply voltage VDD has a direct effect on the power dissipated by the DRAM circuit because the power dissipation is proportional to the square of the voltage.

A smaller refresh time interval $t_{ref}$, however, means that more memory rows in the DRAM circuit are refreshed per second and therefore more power is dissipated by refresh operations. Thus, the energy saving benefit from a lower constant power supply voltage VDD has to be balanced against the disadvantage of a higher refresh operation rate to determine the most energy-efficient DRAM refresh scheme.

Figure 7:
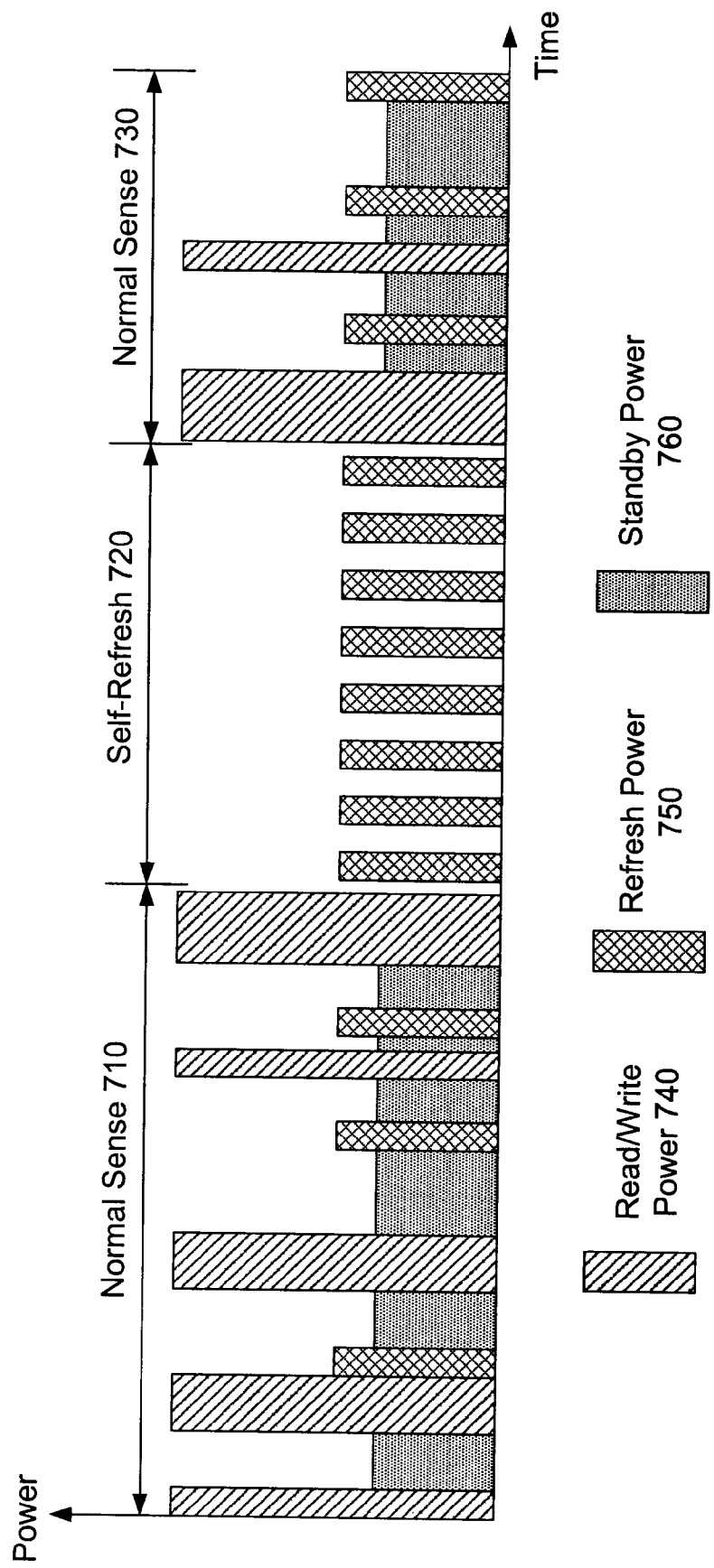
FIG. 7 is a block diagram illustrating the power consumption level of the DRAM circuit of FIG. 6 at different operation modes.

FIG. 7 is a block diagram illustrating the power consumption level of the DRAM circuit of FIG. 6 at different operation modes according to some embodiments of the present invention.

During the normal sense mode 710, the DRAM circuit concurrently performs (i) read/write operations on the set of memory banks 615 and (ii) burst refresh operations on the other set of memory banks 610. For performance reasons, the read/write operations are powered by a constant voltage VDD and therefore consume more power (see Read/Write Power 740) than refresh operations (see Refresh Power 750) supported by a ramped power supply voltage. Because the ramped power supply voltage has a ramp transition time substantially longer than an RC time constant of the DRAM circuit, less power is dissipated into heat (as indicated by the heights of the stripes in the figure). When there is no read/ write operation, the set of memory banks 615 is supported by standby power. The standby power (see Standby Power 760) is even lower than the refresh power because there is no need to charge/discharge any memory cells in the set of memory banks.

Subsequently, the entire DRAM circuit enters a self-refresh mode 720 (e.g., the application including the DRAM circuit is forced to sleep). During this time period, all the memory banks are refreshed by a ramped power supply voltage to conserve more energy. When the application wakes up later, the DRAM circuit enters a new normal sense mode 730. This time, different parts of the DRAM circuit are assigned to different operations in accordance with a predefined schedule. For example, the set of memory banks 615 is powered by a ramped power supply voltage and the set of memory banks 610 is powered by a constant power supply voltage. But the overall power dissipation level is still lower than the power dissipation level if the entire DRAM circuit is powered by the constant power supply voltage.

In some embodiments, a DRAM circuit may perform a read/write operation using a ramped power supply voltage. For example, in this mode of operation a data processor can read out the content in the DRAM circuit in a predicted fashion (e.g., row by row and page by page), but not at high speed. This is acceptable or even preferable if the DRAM circuit's performance concern is outweighed by the corresponding energy saving associated with the use of a ramped power supply.

While the foregoing description and drawings represent the preferred embodiments of the present invention, it will be understood that various additions, modifications and substitutions may be made therein without departing from the spirit and scope of the present invention as defined in the accompanying claims. In particular, it will be clear to those skilled in the art that the present invention may be embodied in other specific forms, structures, arrangements, proportions, and with other elements, materials, and components, without departing from the spirit or essential characteristics thereof. The presently disclosed embodiments are therefore to be considered in all respects as illustrative and not restrictive, the scope of the invention being indicated by the appended claims, and not limited to the foregoing description.

What is claimed is:

1. A method of operating a DRAM memory cell and a sense amplifier, both coupled to a bit line, comprising:
   in a first mode of operation:
      performing a first memory operation on the DRAM memory cell, including amplifying a voltage associated with information stored in the memory cell using a substantially invariant power supply voltage;
   in a second mode of operation:
      performing a second memory operation on the memory cell, comprising a self-refresh operation, including amplifying a voltage associated with information stored in the memory cell using a ramped power supply voltage;
   wherein the ramped power supply voltage has a ramp transition time greater than an RC time constant associated with the bit line and the sense amplifier;
   and wherein the second memory operation on the memory cell includes ramping the power supply voltage in a first direction over a first period of at least the ram transition time performing a first sub-operation, ramping the power supply voltage in a second direction opposite to the first direction over a second period of at least the ramp transition time, and then performing a second sub-operation.

2. The method of claim 1, wherein the ramp transition time is at least ten times as long as the RC time constant and is less than a maximum refresh interval associated with the memory cell.

3. The method of claim 1, wherein the second memory operation on the memory cell includes ramping the power supply voltage from a predefined low voltage to a predefined high voltage over the first period, performing a sense operation, ramping the power supply voltage from the predefined high voltage to the predefined low voltage over the second period, and then performing a restore operation.

4. The method of claim 1, wherein the ramped power supply voltage transitions from a minimum voltage to a maximum voltage during the ramp transition time, and wherein the sense amplifier performs no amplification when the ramped power supply voltage is at the minimum voltage and performs maximum amplification of the voltage associated with the information stored in the memory cell when the ramped power supply voltage is at the maximum voltage.

5. A memory device, comprising:
   a DRAM memory cell coupled to a bit line;
   a sense amplifier coupled to the bit line and having a power input node;
   a first power supply terminal, coupled to the sense amplifier for providing to the sense amplifier a substantially invariant supply voltage;
   a second power supply terminal, coupled to the sense amplifier for providing to the sense amplifier a ramped voltage; and
   circuitry for selectively coupling one of the first power supply terminal and the second power supply terminal to the power input node of the sense amplifier;
   wherein the memory device is configured
      in a first mode of operation, to perform a first memory operation on the memory device, the first memory operation including amplifying in the sense amplifier a voltage associated with information stored in the memory cell using the substantially invariant power supply voltage; and
      in a second mode of operation, to perform a second memory operation comprising a self-refresh operation on the memory device, the second memory operation including amplifying in the sense amplifier a voltage associated with information stored in the memory cell using the ramped power supply voltage; and
   wherein the ramped voltage has a ramp transition time greater than an RC time constant associated with the bit line and the sense amplifier; and
   wherein the second memory operation includes ramping the power supply voltage in a first direction over a first period of at least the ramp transition time, performing a first sub-operation, ramping the power supply voltage in a second direction opposite to the first direction over a second period of at least the ramp transition time, and then performing a second sub-operation.

6. The memory device of claim 5, including mode control circuitry coupled to the selective coupling circuitry to control whether the memory device is in the first mode of operation, in which the power input node is coupled to the substantially invariant supply voltage, or in the second mode of operation comprising a self-refresh mode of operation, in which the power input node is coupled to the ramped voltage.

7. The memory device of claim 5, wherein the second memory operation includes ramping the power supply voltage from a predefined low voltage to a predefined high voltage over the first period, performing a first sub-operation, ramping the power supply voltage from the predefined high voltage to the predefined low voltage over the second period, and then performing a second sub-operation.

8. The memory device of claim 5, wherein the ramp transition time is at least ten times as long as the RC time constant and is less than a maximum refresh interval associated with the memory cell.

9. The memory device of claim 5, wherein the ramped power supply voltage transitions from a minimum voltage to a maximum voltage during the ramp transition time, and wherein the sense amplifier performs no amplification when the ramped power supply voltage is at the minimum voltage and performs maximum amplification of the voltage associated with the information stored in the memory cell when the ramped power supply voltage is at the maximum voltage.

10. A method of operating a DRAM memory device including multiple memory banks, comprising:
concurrently
performing a memory burst-refresh operation on a first memory bank of the DRAM memory device, including refreshing a memory cell in the first memory bank using a ramped power supply voltage; and
performing a memory access operation on a second memory bank, including accessing a memory cell in the second memory bank using a substantially invariant power supply voltage;
the method further including performing a memory self-refresh operation on both the first memory bank and the second memory bank, including refreshing the memory cell in the first memory bank and the memory cell in the second memory bank using the ramped power supply voltage.

11. The method of claim 10, where the ramped power supply voltage has a ramp transition time greater than an RC time constant of a bit line and a sense amplifier coupled to the bit line.

12. A method of operating a DRAM memory device including multiple memory banks, comprising:
during a first time period, concurrently
performing a memory burst-refresh operation on a first memory bank of the DRAM memory device, including refreshing a memory cell in the first memory bank using a ramped power supply voltage, and
performing a memory access operation on a second memory bank, including accessing a memory cell in the second memory bank using a substantially invariant power supply voltage; and
during a second time period, concurrently
performing a memory burst-refresh operation on the second memory bank using the ramped power supply voltage; and
performing a memory access operation on the first memory bank using the substantially invariant power supply voltage.

13. The method of claim 12, where the ramped power supply voltage has a ramp transition time greater than an RC time constant of a bit line and a sense amplifier coupled to the bit line.

14. A method of operating a DRAM memory device including multiple memory banks, comprising:
concurrently
performing a memory burst-refresh operation on a first memory bank of the DRAM memory device, including refreshing a memory cell in the first memory bank using a ramped power supply voltage; and
performing a memory access operation on a second memory bank, including accessing a memory cell in the second memory bank using a substantially invariant power supply voltage,
wherein the ramped power supply voltage has a ramp transition time greater than an RC time constant of a bit line and a sense amplifier coupled to the bit line; and
wherein the memory burst-refresh operation on the first memory bank includes ramping the power supply voltage in a first direction over a first period of at least the ramp transition time, performing a first sub-operation, ramping the power supply voltage in a second direction opposite to the first direction over a second period of at least the ramp transition time, and then performing a second sub-operation.

15. The method of claim 14,
wherein the memory burst-refresh operation on the first memory bank includes ramping the power supply voltage from a predefined low voltage to a predefined high voltage over the first period, performing a sense operation, ramping the power supply voltage from the predefined high voltage to the predefined low voltage over the second period, and then performing a restore operation.

* * * * *